United States Patent
Arena et al.

(10) Patent No.: US 7,732,306 B2
(45) Date of Patent: Jun. 8, 2010

(54) METHODS FOR PRODUCING IMPROVED EPITAXIAL MATERIALS

(75) Inventors: Chantal Arena, Mesa, AZ (US);
Subhash Mahajan, Tempe, AZ (US);
Ranjan Datta, Tempe, AZ (US)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 119 days.

(21) Appl. No.: 12/180,370

(22) Filed: Jul. 25, 2008

(65) Prior Publication Data
US 2009/0091002 A1    Apr. 9, 2009

Related U.S. Application Data

(60) Provisional application No. 60/952,131, filed on Jul. 26, 2007, provisional application No. 61/017,216, filed on Dec. 28, 2007.

(51) Int. Cl.
| H01L 21/36 | (2006.01) |
| H01L 21/20 | (2006.01) |
| H01L 21/00 | (2006.01) |
| H01L 21/331 | (2006.01) |
| H01L 21/203 | (2006.01) |

(52) U.S. Cl. ............ 438/481; 438/41; 438/341; 257/E21.09; 257/E21.097; 257/E21.461

(58) Field of Classification Search ........ 438/481, 438/41, 341; 257/E21.09, E21.097, E21.461
See application file for complete search history.

(56) References Cited

U.S. PATENT DOCUMENTS

| 6,153,010 | A  |    | 11/2000 | Kiyoku et al. ........... 117/95 |
| 6,447,938 | B1 | *  | 9/2002  | Bianchi ................. 428/698 |
| 6,794,276 | B2 |    | 9/2004  | Letertre et al. ........ 438/506 |
| 7,128,786 | B2 | *  | 10/2006 | Jurgensen et al. ......... 117/95 |
| 7,560,364 | B2 | *  | 7/2009  | Bour et al. ............ 438/481 |
| 2002/0005593 | A1 | | 1/2002 | Bourret-Courchesne .... 257/790 |
| 2002/0043208 | A1 | * | 4/2002 | Biwa et al. ............ 117/94 |
| 2003/0180580 | A1 | | 9/2003 | Wada et al. ........... 428/698 |
| 2004/0067648 | A1 | | 4/2004 | Morita et al. ......... 438/689 |
| 2004/0137732 | A1 | | 7/2004 | Frayssinet et al. ..... 438/689 |

(Continued)

FOREIGN PATENT DOCUMENTS

WO    WO 02/44444 A1    6/2002

(Continued)

OTHER PUBLICATIONS

Beaumont et al., "Epitaxial Lateral Overgrowth of GaN," Phys. Stat. Sol. (b) 227(1): 1-43 (2001).

(Continued)

Primary Examiner—Luan C Thai
(74) Attorney, Agent, or Firm—Winston & Strawn LLP (57) ABSTRACT

This invention provides methods for fabricating substantially continuous layers of group III nitride semiconductor materials having low defect densities. The methods include epitaxial growth of nucleation layers on a base substrate, thermally treatment of said nucleation layer and epitaxial growth of a discontinuous masking layer. The methods outlined promote defect reduction through masking, annihilation and coalescence, therefore producing semiconductor structures with low defect densities. The invention can be applied to a wide range of semiconductor materials, both elemental semiconductors, e.g., combinations of Si (silicon) with strained Si (sSi) and/or Ge (germanium), and compound semiconductors, e.g., group II-VI and group III-V compound semiconductor materials.

23 Claims, 4 Drawing Sheets

U.S. PATENT DOCUMENTS

| | | |
|---|---|---|
| 2004/0150001 A1 | 8/2004 | Shchukin et al. ............ 257/183 |
| 2006/0028672 A1 | 2/2006 | Abiko ....................... 358/1.14 |
| 2006/0166390 A1 | 7/2006 | Letertre et al. ................ 438/34 |
| 2007/0026643 A1 | 2/2007 | Tadatomo et al. ........... 438/478 |
| 2007/0037308 A1 | 2/2007 | Okuyama et al. ............. 348/46 |
| 2007/0259464 A1 | 11/2007 | Bour et al. .................... 438/22 |
| 2007/0259504 A1 | 11/2007 | Bour et al. ................. 438/341 |
| 2008/0099781 A1 | 5/2008 | Choi et al. ................. 257/103 |

FOREIGN PATENT DOCUMENTS

| | | |
|---|---|---|
| WO | WO 2007/068756 A1 | 6/2007 |
| WO | WO2008/141324 | 11/2008 |

OTHER PUBLICATIONS

Bohyama et al., "Freestanding GaN Substrate by Advanced Facet-Controlled Epitaxial Lateral Overgrowth Technique with Masking Side Facets," Japanese Journal of Applied Physics 44(1): L24-L26 (2005).

Dovidenko et al., "Study of Thin Films Polarity of Group III Nitrides," MRS Internet J. Nitride Semicond. Res. 4S1, G6.46 (1999).

Dwikusuma et al., "X-ray photoelectron spectroscopic study on sapphire nitridation for GaN growth by hydride vapor phase epitaxy: Nitridation mechanism," Journal of Applied Physics 94(9): 5656-5664 (2003).

Fang et al., "Reduction of threading dislocations in GaN layers using *in situ* deposited silicon nitride masks on AlN and GaN nucleation layers," Applied Physics Letters 84(4): 484-486 (2004).

Gibart, "Metal organic vapour phase epitaxy of GaN and lateral overgrowth," Rep. Prog. Phys. 67: 667-715 (2004).

Haffouz et al., "The effect of the Si/N treatment of a nitridated sapphire surface on the growth mode of GaN in low-pressure metalorganic vapor phase epitaxy," Applied Physics Letters 73(9): 1278-1280 (1998).

Lahrèche et al., "Growth of high-quality GaN by low-pressure metalorganic vapour phase epitaxy (LP-MOVPE) from 3D islands and lateral overgrowth," Journal of Crystal Growth 205: 245-252 (1999).

Napierala et al., "Stress control in GaN/sapphire templates for the fabrication of crack-free thick layers," Journal of Crystal Growth 289: 445-449 (2006).

Stutzmann et al., "Playing with Polarity," Phys. Stat. Sol. (b) 228(2): 505-512 (2001).

Sumiya et al., "Review of polarity determination and control of GaN," MRS Internet J. Nitride Semicond. Res. 9(1): 1-34, Figures for MIJ-NSR 9(1): 1-15 (2004).

International Search Report and the Written Opinion of the International Searching Authority, application No. PCT/US2008/071199, dated Dec. 5, 2008.

International Search Report and the Written Opinion of the International Searching Authority, application No. PCT/US2008/071219, dated Dec. 11, 2008.

Qhalid Fareed et al., "Vertically faceted lateral overgrowth of GaN on SiC with conducting buffer layers using pulsed metalorganic chemical vapor deposition", Applied Physics Letters, 77 15 2000 pp. 2343-2345.

Tanaka et al, "Anti-surfactant in III-Nitride epitaxy—quantum dot formation and dislocation termination", Japanese Journal of Applied Physics, 39 2000 pp. L831-L834.

Iwaya et al, "Reduction of Etch Pit density in Organometallic vapor phase epitaxy on sapphire by insertion of a low temperature deposited buffer layer between high temperature grown GaNn", Japanese Journal of Applied Physics, 37 1998 pp. L316-L318.

* cited by examiner

METHODS FOR PRODUCING IMPROVED EPITAXIAL MATERIALS

CROSS-REFERENCE TO RELATED APPLICATIONS

This application claims the benefit of U.S. Provisional Application No. 60/952,131 filed Jul. 26, 2007 and U.S. Provisional Application No. 61/017,216 filed Dec. 28, 2007, both of which are included by reference herein in their entireties for all purposes.

FIELD OF THE INVENTION

The present invention relates to the field of processing semiconductor materials, and in particular to the field of epitaxial growth of high-quality, mono-crystalline layers of semiconductor materials. The invention provides epitaxial methods for improving the quality of a semiconductor material and provides semiconductor structures produced by such methods.

BACKGROUND OF THE INVENTION

To be suitable for device fabrication, layers of semiconductor materials must have high purity and low density of defects or dislocations. Preparation of quality layers of certain materials, especially compound materials, has been hindered in the past because of a lack of both quality bulk, single crystals, from which individual layers of useful sizes can be sliced, and also of adequate substrates for heteroepitaxial growth of quality layers, from which epitaxial layers can be transferred.

For example, such problems have hindered the development of semiconductors including gallium nitride (GaN); of other Group III nitrides, including, e.g., AlN, InN, GaInN, and other mixed nitrides (referred to herein as "III nitrides"); of certain Group III-V compounds; and of certain other compound materials (e.g., II-VI materials) generally. For many of these materials, semiconductor-quality bulk crystals are not available, and suitable and commercially useful substrates have not been found. A suitable substrate closely matches the crystal properties of the target material to be grown; if these properties do not closely match, the resulting material usually has an unacceptable density of defects and dislocations.

Specifically, in the case of GaN, crystal quality can be improved by pre-treatment of the growth substrates, e.g., by nitridization and other chemical modifications; by growing thin, low temperature buffer layers of other III nitrides, e.g., AlN or GaN, by thermal annealing, and the like. Crystal quality has also been improved by exploiting epitaxial lateral overgrowth (ELO). Despite these advances, available GaN layers still have significant numbers of defects and dislocations.

Such problems have hindered development of alloy semiconductors, e.g., alloys of silicon (Si) and germanium (Ge), Ge layers on Si substrates, and strained Si (sSi) layers. Although crystal quality can be improved by growing these materials on buffer layers having a graded composition, improvements are required to meet ever increasing demands for higher quality.

Clearly, layers and crystals of compound and alloy semiconductors of improved quality are desirable. However, widely applicable processes for doing so are scarcely known in the prior art.

SUMMARY OF THE INVENTION

The present invention includes methods for fabricating semiconductor structures with surface layers of improved qualities, i.e. with fewer defects and dislocations. The invention also includes semiconductor structures fabricated from such methods. The methods of the invention are now briefly described in preferred embodiments.

Firstly, the methods of an embodiment of this invention make use of a support substrate with an exposed surface suitable for the growth of semiconductor materials. A layer of material (usually a semiconductor) is formed on the exposed surface of the support substrate, substantially covering the entire surface. The substrate and film of applied material are thermally treated to a sufficient temperature, in a suitable environment to effect the transformation of the applied layer into a plurality of island like structures. The description of this transformed layer as "island like" is fitting since the thermal treatment converts the formerly substantially continuous layer of material into substantially spatially isolated, distinct entities which are bordered at their base regions by the original support substrate. The parameters for the formation and heating of the initially continuous layer of material are optimized for producing island like structures appropriate for subsequent material growth, e.g., epitaxial lateral overgrowth (ELO). In particular, the parameters are optimized for producing island like features having suitable dimensions and spatial separation for providing high quality material growth via ELO. Such process optimization is routine in the art.

Following the formation of island like features of material, a masking material is applied to the surface of the substrate with the island features thereon. The masking material is applied in such a manner as to result in substantially covering of those portions of the original support substrate that remain exposed between the island like features, while leaving uncovered and exposed a substantial portion of the island features themselves. In particular, a significant portion of side facets of the island like features preferably remain uncovered and exposed and therefore accessible for subsequent material growth, e.g., according to ELO, whilst at the same time masking a significant portion of the base substrate.

Next, further material deposition is performed preferably utilizing parameters optimized to favor horizontal, or two-dimensional, material growth. Such a growth mode is known in the art as an ELO growth mode. Two-dimensional growth will to a degree preferentially nucleate from the exposed portions of the side facets of the island like features, whilst nucleation will be limited from the upper surfaces of the island features, and nucleation will be even more limited, preferably only rarely, from the masked portions of the base substrate. The ELO growth mode is continued preferably from the island features thereby producing a two-dimensional filling of the regions in between the island like structures. Upon coalescence of the islands into a continuous film the growth continues in the form of a planar film, and growth parameters may then be altered to favor such vertical growth The planar film produced by the embodiment outlined above has been found to have a reduced density of surface defects in comparison to a planar film grown directly on a support substrate without performing the above steps of the invention. For example, it has been observed that, in the case of GaN grown on sapphire, direct growth of the planar film can result in about $10^{10}/cm^2$ or more of surface defects or dislocation, whilst growth according to this invention can result in about $5 \times 10^8/cm^2$ or less of surface defects or dislocations. Layers epitaxially grown by the methods of this invention will have improved qualities because dislocations (generally surface regions of disordered crystal structure) have been reduced through coalescence and annihilation.

Without being limited to a particular theory, it is believed that this defect reduction is due to bending and then annihilation of defects that have originated at the substrate interface and then propagated into the growing material. Defects in the island like structures that intersect lateral facets of these structures, when they propagate into the subsequently grown material, assume a trajectory that is more horizontal than their original trajectory in the island like structures. This bending of defects increases the probability for defects with opposite burgers vectors to meet and then annihilate. The subsequent epitaxial lateral overgrowth of the material over the masked portions of the substrate with the island features thereon are believed to result in defect coalescence/annihilation in succeeding growth layers.

However, unlike the multitude of prior art related to the use of ELO for defect reduction, the method and embodiments outlined herein do not require external processing (e.g. deposition, lithography, etching, etc.) for providing the patterned mask. The embodiments outlined herein therefore greatly simplify the ELO process whilst producing material with a significantly reduced level of defects.

The invention has application to a wide range of semiconductor materials and combinations thereof, both elemental semiconductors and compound semiconductors. For example, it can be applied to combinations of Si (silicon) with strained Si (sSi) and/or Ge (germanium), and to group II-VI and group III-V semiconductor materials. Particular applications are to growing pure or mixed nitrides of the group III metals (III nitrides) Al, Ga, and In, e.g., AlN, GaN, InN, AlGaN, GaInN, and especially to low-defect-density, monocrystalline GaN layers.

In particular, preferred embodiments of this invention provide methods for growing a layer of a semiconductor material with reduced defects and dislocations that include the steps of forming a plurality of island like structures having a seed material that are arranged on a base substrate without regular pattern, then applying a masking material to the base substrate, and finally epitaxially growing the semiconductor material so that growth initiates primarily on the seed material of the island-like structures not covered by the masking material and so that growth then continues to form a substantially continuous layer. The island like structures can be formed by growing a substantially continuous layer of the seed material on the base substrate, and then thermally treating the base material with the seed material thereon. These methods preferably produce layers of semiconductor material where the density of defects and dislocations appearing at the surface of the substantially continuous layer is less than the density of defects and dislocations occurring adjacent to the base substrate.

The semiconductor material used in these methods can include an elemental semiconductor, or an alloy semiconductor, or a III-V compound semiconductor or a II-VI compound semiconductor. Preferably, the masking material acts as an anti-surfactant with respect to the semiconductor material, and the seed material acts as a promoter of growth initiation for the semiconductor material.

Further preferred embodiments provide methods for growing a layer of a selected III-nitride semiconductor material with reduced defects and dislocations that include the steps of depositing a layer of a III-nitride seed material onto a base substrate, then thermally treating the base substrate so that a plurality of island like structures of the III-nitride seed material are formed on the base substrate and are arranged without regular pattern, then applying a dielectric material to the base substrate, and finally epitaxially growing the selected III-nitride semiconductor material so that growth initiates primarily on the portions of the island-like substrates not covered by the dielectric material and then continues to form a substantially continuous layer. These methods preferably also produce layers of semiconductor material where the density of defects and dislocations, preferably less than about $5 \times 10^8/cm^2$, appearing at the surface of the substantially continuous layer is less than the density of defects and dislocations occurring adjacent to the base substrate.

In preferred uses and applications, the III-nitride semiconductor material can include gallium nitride, or aluminum nitride, or indium nitride, or mixtures thereof; the III-nitride seed material can include gallium nitride, or aluminum nitride, or indium nitride, or mixtures thereof; and the dielectric material can include a silicon nitride or a silicon oxide or mixtures thereof. Preferably, the step of thermally treating is such that the island like structures have an average spacing of between about 0.1 and about 10 µm, and/or that at least a portion of the thermal treatment occurs at a temperature of at least 1100° C. Further, all steps of these methods, that is the depositing, the thermally treating, the applying, and the epitaxially growing, can be performed within a single reactor, and also within a single growth cycle.

Further preferred embodiments provide semiconductor structures having a base substrate, a plurality of island like structures of a seed material that are suitable for the growth of III-nitride materials and that are arranged on the base substrate without regular pattern, and a layer of masking material over the base substrate through which emerge a majority of the island like structures.

Preferably, the masking material includes a dielectric material which can be a silicon oxide or a silicon nitride or mixtures thereof, and the masking layer preferably has a thickness that is less than about 100 Å., or 50 Å. or 20 Å (or values between these limits). Preferably, the seed material includes GaN, InN, AlN and alloys thereof, and the island like structure having the seed material have a spatial density suitable for producing a low defect density III-nitride film by mean of subsequent epitaxial lateral overgrowth. A particularly preferred spatial density is an average spacing of between about 0.1 to about 10 µm.

Further, the semiconductor structures can have an overlying layer of a III-nitride material that has a substantially continuous planar surface and that has a base contiguous with at least a portion of the seed material of the island like structures. This layer preferable has a defect density of less than about $5 \times 10^8/cm^2$ The term "substantially" is used herein to refer to a result that is complete except for the deficiencies normally expected in the art. For example, a pattern is "substantially random" if it does not appear to have any regular pattern upon routine inspection. Thus, a "substantially random" pattern need not be random in an exact mathematical sense. Furthermore, an epitaxial layer cannot routinely be expected to be completely continuous (or completely monocrystalline) across macroscopic dimensions. However, an epitaxial layer can routinely be expected to be "substantially continuous" (or "substantially monocrystalline") across macroscopic dimensions where the discontinuities (or crystal domains, or crystal boundaries) present are those expected in the art for the processing conditions, the material quality sought, or so forth.

Similarly, a semiconductor layer having "substantially no defects and dislocations" is used herein to mean that the semiconductor layer has a density of defects and dislocations that is at least low or very low in comparison to what is common in the art for the material of the semiconductor layer. For example, in the case of GaN, "substantially no defects and dislocations" (or a low or very low density of defects or dislocations) is taken to refer to herein to defect or dislocation densities of less than approximately on the order of $10^5/cm^2$ to $10^7/cm^2$, and especially less than approximately on the order of $10^5/cm^2$. The defect density in the group III nitrides is measured by methods well known to those familiar in the art, including, atomic force microscopy, optical microscopy, scanning electron microscopy and transmission electron microscopy. The preferred method for measuring the defect density is by transmission electron microscopy (TEM).

Other examples include semiconductors comprising Ge and Si. In the case of Ge and Si, e.g., $Si_{1-y}Ge_y$ where y>0.2, "substantially no defects and dislocations" (or a low or very low density of defects or dislocations) is taken to refer to herein to defect or dislocation densities of less than approximately on the order of $10^3/cm^2$ to $10^4/cm^2$, and especially less than approximately on the order of $10^3/cm^2$. In the case of applications to Ge on Si "substantially no defects and dislocations" (or a low or very low density of defects or dislocations) is taken to refer to herein to defect or dislocation densities of less than approximately on the order of $10^4/cm^2$ to $10^5/cm^2$, and especially less than approximately on the order of $10^4/cm^2$.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which.

DETAILED DESCRIPTION OF THE PREFERRED EMBODIMENT

The methods of the invention are observed to produce layers of semiconductor material with reduced surface defect/dislocation density. It is believed that this reduction is due to the processing steps that promote the bending of defects and dislocation during epitaxial growth of a semiconductor material thereby reducing the surface defect/dislocation density of the semiconductor material.

First, by way of a brief introduction, the significant differences between the methods of the present invention and known methods (illustrated in FIG. 1) are highlighted. Following this introduction, preferred embodiments of the invention are described with reference to FIGS. 2A-2F. Examples are then described with reference to FIGS. 3-4. Further, for conciseness and convenience only and without limitation, the following description and figures reflect common characteristics of the III nitrides, particularly of GaN. For example, III nitrides are often necessarily grown on substrates that do not have closely matching crystal properties. The growing III nitride layer therefore often has numerous defects and dislocations (generally regions of disordered crystal structure) originating at the substrate interface, continuing into the growing layer, and emerging as surface defects.

Figure 1:
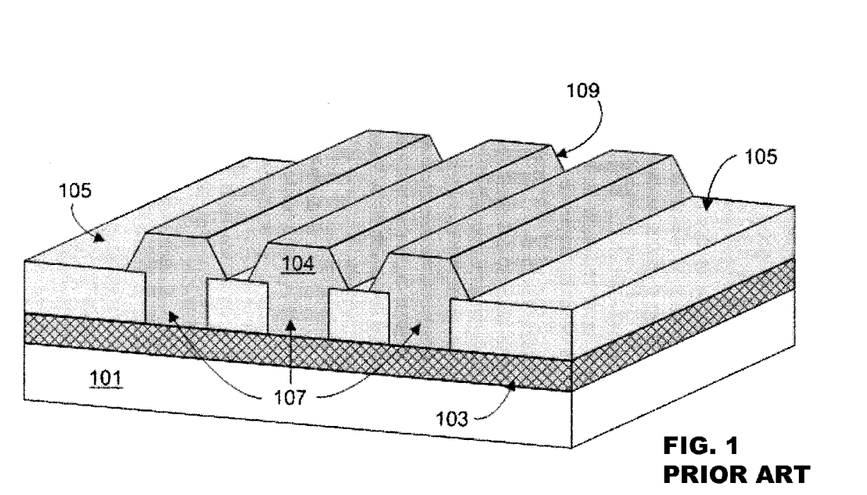
FIG. 1 illustrates an exemplary prior art process.

In established methods for growing GaN layers, a substantial continuous GaN template layer 103 is covered with a patterned mask and GaN material is grown through openings in the mask. FIG. 1 illustrates substrate 101 with template 103 that is partially covered by regularly patterned mask 105 with regularly arranged mask openings 107. Regularly patterned masks are usually prepared using standard photolithography. Next, GaN is grown on the masked substrate so that it first nucleates on portions of the surface of template 103 that are exposed through mask openings 107 (instead of on the mask), and then grows vertically through the mask openings. In the final stages of growth the GaN extends laterally 109 over the mask. If the substrate and mask materials are properly selected and if the mask openings are properly spaced apart, after a time, the laterally growing GaN 109 will eventually coalesce to form a layer of GaN.

In contrast, processes of the invention described herein, initially grow discontinuous GaN island like structures and then mask exposed portions of the substrate, as opposed to the prior art wherein the masking layer is formed first and then GaN is grown through the unmasked regions. FIG. 2d illustrates this contrast more clearly, where GaN (or other III nitride material) is produced in the form of separated islands 9, here shaped as truncated pyramids on base substrate 3. Next, processes of the invention grow (or otherwise deposit) masking material 17 (e.g., silicon nitride) preferentially in a discontinuous film, thereby masking portions of the base substrate and the GaN islands, the masking material disproportionately depositing on the base substrate to a depth sufficient to substantially cover exposed portions of the substrate.

Although further processing steps are described below, it is apparent that these initial steps grow discontinuous islands and then mask, which is significantly different to methods that grow continuous layers and then mask. Such improved process provided by this invention lead to significant advantages, among which are a lower density and improved distribution of those defects that can arise upon the merger of laterally growing faces.

Further, prior art processes often utilize standard photolithographic techniques to produce the masking regions and therefore masking dimensions are limited by the physical limitations of photolithographic techniques, e.g. for stripe formation as demonstrated in FIG. 1. The mask dimensions provided through standard photolithographic techniques are sufficiently large such that when the lateral growth faces coalesce there is a high probability that crystal tilt and/or twist can have occurred between the two merging crystal fronts resulting in a high density of defects at the point of merger between the lateral overgrown faces. Therefore, when considering the example in FIG. 1 employing striped mask geometries, the surface defects are non-randomly distributed over the surface of the epilayer, resulting in areas with high levels of defect densities and areas with comparatively low levels of defect densities. Although this non-random distribution of defects is satisfactory for certain device with particular geometries, i.e. laser structures consisting of thin stripe geometries can avoid defected material, wider area geometry devices such as transistors and light emitting diodes have a device area which could comprise both high and low quality material. A mixture of both high and low quality material encompassed within a single device is detrimental to optimized device performance.

In contrast, the methods of the invention produce a more advantageous defect distribution, namely having a lower density of defects more randomly distributed over the surface of the III-nitride epilayer. The present invention produces substrates favorable for ELO growth and having island like structures of nitride material distributed without regular pattern (that is, distributed "randomly" or "substantially randomly") between which a discontinuous layer of silicon nitride material preferentially masks most or all exposed portions of the base substrate. The islands preferably act as seeds for promoting subsequent ELO, and are not only randomly arranged but more closely spaced than can be achieved with standard photolithography. Because of such close spacing (and similar close spacing between lateral crystal growth fronts), fewer defects are produced when crystal fronts growing from different island like structures merge. The methods of invention therefore lead to fewer and randomly distributed surface crystal defects.

In preferred embodiments, the island like structure comprise materials that promote subsequent epitaxial growth of the intended semiconductor material that initiates or nucleates on the island-like structures. In other words, the island like structure comprise materials that can act to "seed" subsequent epitaxial growth of the intended semiconductor material. Further, the masking materials preferably comprise substances that hinder subsequent epitaxial growth of the intended semiconductor material (e.g., a III-nitride semiconductor material) so that little or no initiation or nucleation occurs on the masking layer. In other words, the masking materials preferably comprise substances that act as "antisurfactants" with respect to the intended semiconductor material (e.g., a III-nitride semiconductor material).

Further advantages of the improved processes of this invention are described subsequently, beginning with a more detailed description of the preferred embodiments of the invention with reference to FIG. 2. Firstly, the methods of the preferred embodiment of this invention make use of a base substrate 3 with an exposed surface 1 suitable for the growth of gallium nitride (or other III nitride materials), see FIG. 2a. Preferred base substrates 3 have physical properties, e.g., crystal lattice sizes and structures, coefficients of thermal expansion, and the like, that are similar to GaN (or other III nitrides), or that otherwise promote growth of high-quality GaN. Preferred base substrates can be non-composite (i.e., homogenous), or can be composite structures, where one component provides similar coefficients of thermal expansion and another component provides similar crystal lattice sizes and structures. For example, a composite substrate may consist of a sapphire-on-insulator-on-SiC (or AlN) structure, where the sapphire provides a reasonable lattice match, required to limit the formation of defects in the epitaxial layer, and the SiC (or AlN) provides a match in the coefficient of thermal expansion, preventing thick III-nitrides from cracking upon cooling. Other composite substrates include, but are not limited to GaN-on-insulator (GaNOI), silicon-on-poly-silicon-carbide (SopSiC) and SiC on poly-crystalline SiC (SiCopSiC). Other possible non-composite substrates include sapphire, silicon carbide, silicon, silicon oxide, gallium arsenide, lithium gallate, lithium aluminate and the like, with sapphire being preferred.

Figure 2A:
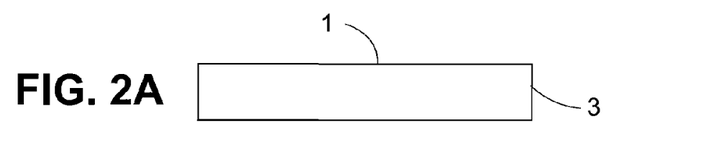
FIGS. 2A-F illustrate steps of a preferred embodiment of the invention.
Figure 2B:
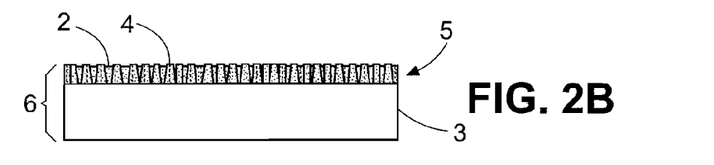

Referring to FIG. 2b, a substantially continuous nucleation layer 5 is applied to a base substrate 3, the nucleation layer comprising a plurality of nuclei 2 and defects 4. Prior to describing nucleation layer 5, the use herein of the term "nucleation" is explained. Epitaxial growth (and crystal growth generally) typically begins with the spontaneous formation of minute crystallites which serve as seeds for the growth of macroscopic crystals. The minute crystallites are referred to herein as "nuclei" 2 and the processes of their formation and initial growth are referred to as "nucleation". In the case of epitaxial growth which nucleates on surfaces, the properties of the surface can strongly influence the spatial configurations and crystal properties of the nuclei by, e.g., making certain configurations and properties more stable than other configurations and properties. The term nucleation layer refers to such surface properties whether achieved by deposition/growth of buffer layers, or by surface chemical treatments, or by other means.

Preferred nucleation layers promote GaN (or other III nitride) nucleation with selected spatial density and with selected crystal properties. In the present preferred embodiment, the growth conditions of the nucleation layer are selected to provide a high density of GaN nuclei 2 (e.g. by low temperature deposition), thereby forming a preferably substantially continuous layer. When describing the nucleation layer as continuous, it is not to say that that the layer necessarily consists of a single GaN crystal that covers the upper exposed surface 1 of the base substrate. In this context a "continuous" film typically refers to a highly densely packed plurality of GaN nuclei 2 which substantially envelops all or almost all of the base substrate upper surface 1, as shown schematically in FIG. 2b.

It has been demonstrated that the structural, electric and optical properties of a subsequent GaN epilayer grown on a nucleation layer is highly influenced by the deposition parameters utilized in the growth of the nucleation layer. Therefore the properties of GaN epilayers subsequently grown from the nucleation layer are reliant on nucleation layer deposition parameters, e.g. layer thickness, growth rate, deposition temperature etc. In a preferred embodiment nucleation layer 5 is formed at a relatively low temperature of less than 600° C. or more preferably less than 550° C. or in a more preferred embodiment less than 525° C. Low temperature nucleation, as known in the prior art, is highly favorable for increasing the density of nucleation sites on a selected base substrate, leading to an increase in GaN epilayer quality (see Amano et al. Applied Physics Letters, 48, 353, 1986). The nucleation layer in preferred embodiment has a thickness of less than 100 nm, or more preferably less than 75 nm or in a more preferred embodiment less than 50 nm. The nucleation layer can be formed on a suitable substrate by a multitude of methods known in the art, including but not limited to physical vapor deposition, sputter deposition, molecular beam epitaxy, spin-on methods and chemical vapor deposition. In preferred embodiments of the invention the nucleation layer is formed by the various methods of chemical vapor deposition (CVD), for example including but not limited to, plasma-enhanced CVD, atomic layer CVD, metallorganic CVD and Hydride (Halide) vapor phase epitaxy (HVPE).

Figure 2C:
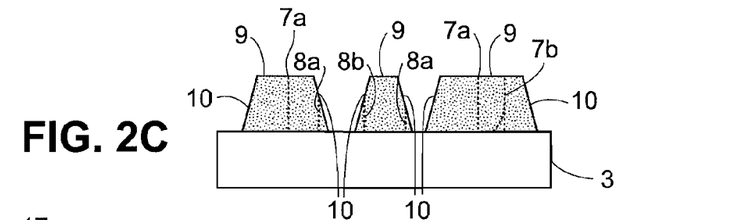
Figure 2D:
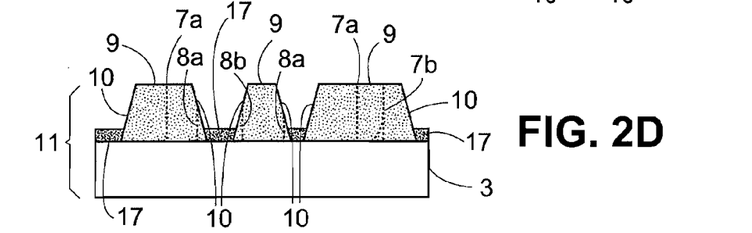

The presence of the aforementioned nitride nucleation layer alone can be insufficient to provide an ensuing high quality GaN epilayer. However, a high temperature thermal treatment of a nucleation layer can result in a greatly improved base for high quality, low defect density nitride materials (see Wickenden et al. Journal of Applied Physics, 75, 5367, 1994). Referring to FIG. 2b, article 6 (comprising the base substrate 3 covered with the initial nucleation layer 5) is heated to a temperature adequate to promote the transformation of the nucleation layer into a series of randomly arranged (in other words, arranged "without regular pattern"), substantially spatially separated islands of nitride material. When referring to the islands as substantially separated it should be understood that although the majority of the regions between the islands are free of nitride material as shown in FIG. 2c, there may still remain a small amount of residual nitride in some regions.

The heating of article 6 can be performed via a variety of means known in the prior art including, but not limited to furnace, oven, hot plate and rapid thermal processes. In a preferred embodiment, article 6 is heated via the CVD reactor utilized for nucleation layer formation, thereby eliminating the need to remove the article from the reactor and the resulting problems imposed due to exposure to atmosphere and growth interruption.

Prior to outlining the preferred parameters for nucleation layer thermal treatment some mention is made for the basis for performing such an annealing procedure. Although a low temperature nucleation layer provides an improved base for subsequent epilayer growth, as the reactor temperature is increased towards GaN growth temperatures (i.e. 900-1100° C.) the structure of the initial nucleation layer evolves significantly. The initial nucleation layer is typically highly defected due to the disparity in crystal properties between the base substrate and the nucleation layer. Referring to FIG. 2b, the nuclei 2 of nucleation layer 5 have crystalline qualities non-ideal for high quality material growth. The nuclei comprise faceted 3D structures that can possess both the zincblende and wurtzite crystal structure, whilst the low temperature growth conditions are thought to contribute to a high density of crystal defects 4 (e.g. dislocations, stacking faults) observed within the nitride nuclei. Nevertheless, upon raising the temperature of the nucleation layer, under optimized conditions, a transformation takes place which results in a much improved crystalline structure (as is known in the art).

In more detail, during thermal treatment of the nucleation layer the surface morphology of the layer changes remarkably (see FIG. 2c) resulting in randomly arranged island like structures 9 with side facets 10. The crystal quality of the island like structure is greatly improved as demonstrated by the reduction in defects shown schematically in FIG. 2c. Two categories of defects are apparent in FIG. 2c, those that are in close proximity to the side facets 10 of the island structures, e.g., defects 8 (*a* and *b*), and those that are substantially further away from the island side facets, e.g., defects 7 (*a* and *b*). This distinction is important because the subsequent propagation behavior of the two defect categories is different.

As also known in the art, nucleation layer growth parameters (i.e. thickness, temperature, gaseous ambient, etc.) as well as the nucleation layer heating parameters (temperature, ramp rate, ambient, hold time, etc.) can have a dramatic effect on the subsequent characteristics of the island structures formed and consequently on the final epilayer. Therefore, the parameters for the annealing of article 6 are selected in view of the subsequent application of ELO techniques. ELO is known in the art to produce substantially continuous and monocrystalline layers of GaN of better quality. However, material quality can depend on the availability of sufficient growth sites from which ELO can be initiated. Additionally, the spacing of such growth sites should be optimized such that ELO from different growth sites coalesce into a monocrystalline layer with minimal grain boundaries. Generally, it is preferred that island structures 9 are spatially separated in much a manner as to promote subsequent high quality ELO with a spacing on average of between 0.1-10 μm and more preferably between 0.2-3 μm.

Overall parameters for nucleation layer growth and annealing are optimized to form nitride island structures with an average spacing of between 0.1-10 μm and more preferably between 0.2-3 μm, thereby reducing the probability of crystal tilt/twist between lateral growth facets, resulting in improved defect/dislocation density of material.

Referring now to FIG. 2d, a thin masking material 17 is applied to the upper surface of article 11 (formed from the combination of the base substrate and the nitride island structures), preferably in a manner so that a significant portion of side facets 10 of the island like features remain non-masked and accessible for subsequent material growth, whilst at the same time masking a significant portion of the base substrate 3. In other words, significant portion of side facets of the island like features emerge through the masking material, The masking materials preferably comprise substances which act as anti-surfactants to III nitride growth, thereby limiting the amount of nucleation in masked portions of article 11. Deposition of anti-surfactant materials onto a secondary material changes the surface growth kinetics by reducing the sticking coefficient (i.e. the probability of adsorption of a chemical species on a surface). Therefore in the case of GaN the anti-surfactant can substantially preclude the adsorption and incorporation of Ga onto the anti-surfactant surface and subsequently prevents the nucleation of GaN. In a preferred embodiment the anti-surfactant material comprises dielectric materials; examples of such materials comprise silicon oxides, silicon nitrides and mixtures thereof.

In a preferred embodiment, silicon nitride is utilized as a dielectric masking material 17. The silicon nitride can be formed on the surface of article 11 employing a number of well know methods know in the art, for example. PVD, MBE, sputter deposition and spin-on coating techniques. However, it is advantageous that the deposition of the dielectric masking layer be performed in the reactor chamber utilized for the proceeding growth and annealing of the nucleation layer. As mentioned previously with regards to nucleation layer formation and annealing within the same reactor, it is desirable to perform the entire growth procedure within a single reactor without exposure to atmosphere for ex-situ processing. Therefore a single growth cycle would include, but is not limited to substrate pretreatments, nucleation, nucleation layer thermal treatment, dielectric masking deposition, epitaxial lateral overgrowth and continued growth of the planar film until a desired thickness is achieved, all of the above steps achieved without opening the reactor to atmosphere. The ability to exclude ex-situ processing requirements not only significant simplifies process protocols but also reduces operational costs considerably due to equipment simplifications.

A silicon nitride layer can be grown to substantially cover the exposed portions of the base substrate by CVD processes, e.g., from gaseous silane ($SiH_4$) and ammonia ($NH_3$) under conditions known in the art. CVD reactors for producing III-nitride materials frequently employ $NH_3$ as a source for the Group V element containing precursor, therefore for deposition of silicon nitride the only requirement is the additional of a $SiH_4$ input to the reactor chamber, along with any additional auxiliary fixturing. The growth thickness of the silicon nitride layer 17 is preferable maintained at a mean value below approximately 20 Å to further promote the discontinuity of the masking layer coverage over article 11.

As seen in FIG. 2d, the base substrate 3 is substantially covered with the preferred silicon nitride dielectric material

17, whilst a significant portion of the island like III nitride features 9 remain non-masked, free of masking materials. The discontinuous masking layer leaves a significant portion of side facets 10 of the island like features 9 non-masked and accessible for subsequent material growth; whilst at the same time masking a significant portion of the base substrate. In a preferred embodiment the base substrate is a (0001) sapphire substrate commonly utilized for the growth of III-nitride materials.

During the deposition of the thin, discontinuous layer of silicon nitride, a greater portion of silicon nitride deposits on the sapphire substrate as compared with the level of deposition on the nitride island like structures. This is not to say that the nitride island features are entirely free of masking material and that the sapphire substrate is entirely covered. However, experimental evidence corroborates that a disproportionate amount of masking material covers the sapphire base substrate compared with the nitride island like structures.

Silicon nitrides and silicon oxides (and other) masking materials are provided to prevent nucleation in particular regions of the wafer, instead of which material nucleates from non-masked seed materials and grows up from such seeds and laterally over the masked regions. Since the lateral material growth is initiated from seed crystals with matching crystal properties (e.g. lattice parameters, coefficient of thermal expansion etc) the resulting epilayer has a significant reduction in defect/dislocation density.

The seed crystals for ELO in the embodiment set forth for this invention consist of the lateral faces 10 of the island like structures 9 (FIG. 2d). Growth parameters are therefore optimized for lateral growth from the side facets 10 of the island like structures 9. Conditions favoring either vertical or lateral growth are known and described in the art for the common VPE processes, e.g., the MBE, MOCVD, or HVPE processes. See, e.g., U.S. Pat. No. 6,325,850; see also phys. Stats. Sol (c) 3, No. 6 1750-1753 (2006). Generally, the relative rates of lateral versus vertical growth are known to be influenced by growth temperature, V/III precursor ratio, composition of the carrier gas ($H_2$ or $N_2$, or a combination thereof) and reactor pressure. For example, lateral growth is enhanced by higher growth temperatures, or by an increased V/III ratio, or by a greater $N_2/H_2$ ratio, or by lower pressures (less than or about 1 atm.), or by a combination thereof.

Figure 2E:
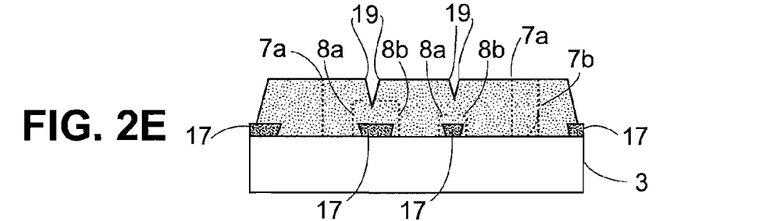
Figure 2F:
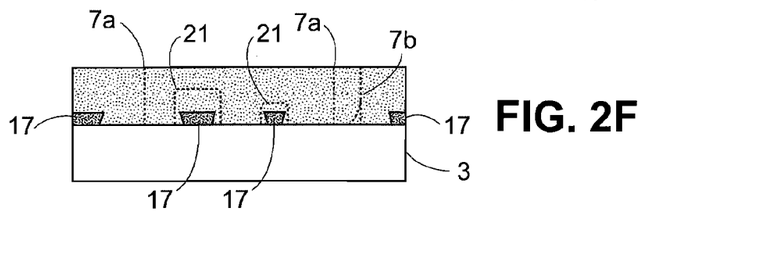

FIG. 2e demonstrates the ELO growth from the island features prior to full coalescence of the lateral growth fronts. The defect/dislocations 7 (a and b) (commonly threading dislocations) which emerge on the upper surface facets of the island like structures remain unaffected during the subsequent lateral overgrowth. However, the defect/dislocations 8 (a and b) that intersect an island side facet are shown to alter their direction of propagation, bending to a more horizontal direction.

The presence of the discontinuous silicon nitride layer 17 is shown to not only result in a masking effect, as in standard ELO techniques, but also has a defect bending effect. The bending of defects away from the (0001) direction, i.e. the crystal growth direction, increases the statistical probability that two defects can interact, commonly resulting in defect coalescence/annihilation and a subsequent reduction in defect density.

It is known that two defects can approach each other and merge (coalesce) with one another forming a single onward propagating defect 7b. If the two defects approach from opposite directions, coalescence can lead to the mutual annihilation of the two defects 8a and 8b. In the art, a defect is often characterized by its Burgers vector, and defect coalescence/annihilation can be described in terms of the composition of the Burgers vectors of the defects. Such defect interactions, as well as defect bending and other effects, are believed to be governed by least energy effects.

In addition to the defect reduction via annihilation of two dislocations with opposite Burgers vector, another process for defect reduction resulting from the bending of defects is dislocation coalescence, i.e. the merging of two separate defects resulting in a single defect. In these processes two dislocations with different Burgers vectors interact and combine to form a new single dislocation, as long as the conservation law of Burger's vectors in the dislocation network is satisfied, examples of such interactions are illustrated in the work of Shen et al (Applied Physics Letters 87, 101910, 2005) and is shown schematically as 7b in FIG. 2c.

Therefore, the change in the propagation direction of the dislocations resulting from the facetted islands, in-situ masking and ELO, results in a significant increase in the propagation of defects in a direction other than the crystal growth direction (0001). The resulting alteration of propagation direction increases the probability that defects will interact with each other and subsequently increases the likelihood of defect annihilation and coalescence.

Further lateral growth from the side facets of the island like nitride features will promote defect bending and increase the probability of defect/dislocation annihilation/coalescence. Continued growth ultimately leads to the film coalescing into a substantially continuous, planar epilayer of nitride material, see FIG. 2f. As growth fronts propagate from individual islands their properties can progressive change, a process known in the art as "crystal tilt/twist". Advantageously, in this invention, the growth fronts 19 from the lateral overgrowth from the island like features meet without the introduction of a substantial addition of defects resulting from crystal tilt/twist. As previously outlined the reduced distance between the ELO growth faces, compared with that of the prior art, reduces the probability of producing further dislocations upon film coalescence, thereby greatly improving surface defect density.

Figure 3:
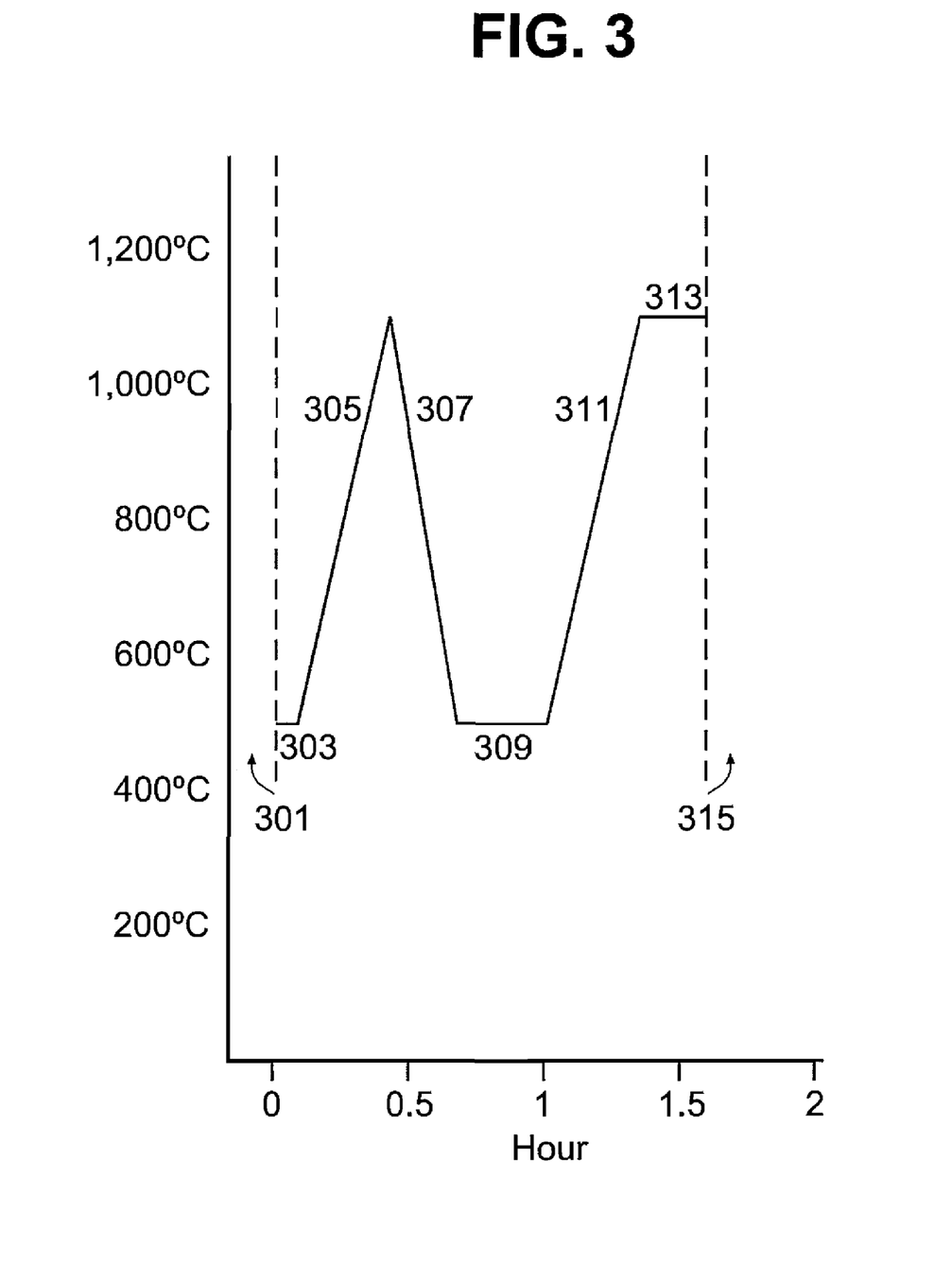
FIG. 3 illustrates an example of the invention.

FIG. 3 illustrates an example of the times and temperatures for the process outlined herein for the reduction of defects in epitaxial materials. It should be understood that the times and temperatures illustrated in FIG. 3 are for illustrative purposes only and are not to be taken as limiting. For example, the growth temperature range of 900-1150° C., and the annealing cleaning temperature range of 900-1150° C. are suitable for III-nitride, e.g., GaN, growth. For other materials these temperatures can be different.

The opening stage of the illustrated process commences at time zero with the growth of a nucleation layer 303. It should be noted that a multitude of process stages may be performed prior to the growth of the nucleation layer, taking place in time period 301. Process stages 301 may include, but are not limited to, a substrate cleaning cycle to remove unwanted contaminates (e.g. a high temperature bake in hydrogen containing ambient), nitridization of the upper surface of the substrate or further surface pretreatments dependent on the chemistry of both the growth material and the base substrate.

The growth of the nucleation layer takes place at a temperature of approximately 500° C. for a period of 20 mins 303. The temperature of the reactor is subsequently raised for thermal treatment of the nucleation layer thereby transforming the layer into a plurality of spatially separated island like features 305. In this example the temperature in the reactor is raised to a temperature of 1100° C. in a time period of 20 mins, although it should be appreciated that the temperature and ramp rate can be wide-ranging depending on the spatial density and size of the island like features that are required.

The temperature of the reactor is then cooled 307 down to a temperature of approximately 500° C. over a time period of 15 minutes. Silane gas and ammonia gas are introduced into the chamber for the growth of the discontinuous masking layer 309, in this instance the growth time period is 20 minutes at a temperature of approximately 500° C., however the density of non-masked regions that emerge through the mask can be regulated via the deposition parameters.

On completion of the discontinuous masking layer the reactor temperature is again raised 311 up to a growth temperature of 1100° C. The precursor flow parameters for the initial stages of bulk growth are optimized for ELO, resulting in a 2D growth mode and upon III nitride coalescence into a continuous film the flow parameters are again varied for growth of the remaining bulk GaN material The time period for growth of the GaN layer is dependent on the target thickness required and the sustainability of the reactor process, it should also be noted that in time period 315 a number of subsequent process can be performed in addition to those of growth termination and reactor cool down. Further process steps could include addition processes for defect reduction as well as cooling and ramping cycles for the growth of a multitude of III-nitride containing materials, e.g. for the creation of device structures.

Examples

Figure 4:
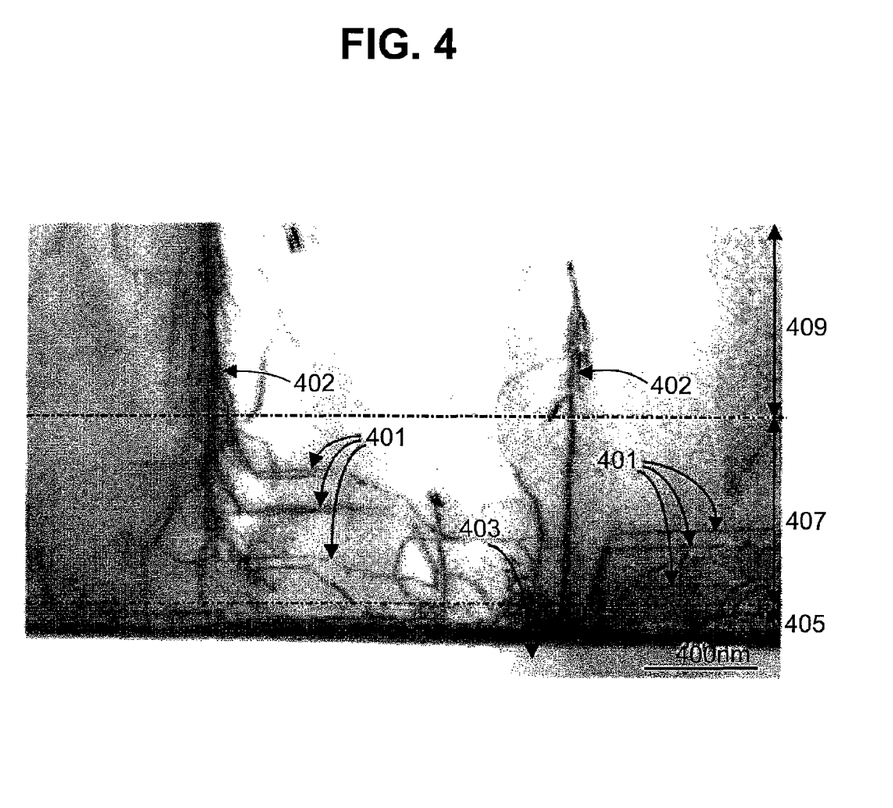
FIG. 4 illustrates a further example of the invention.

FIG. 4 illustrates an example of a gallium nitride sample grown by the methods described above. FIG. 4. demonstrates a transmission electron micrograph (TEM) imaged from a cross-section sample of a gallium nitride crystal grown on (0001) sapphire substrate with diffraction condition g=<11-20>. The sapphire substrate is shown at the bottom of the image 403 and the plurality of dark lines in the image corresponds to defects in the GaN crystal. Defect structures 402 are unaffected by the introduction of the dielectric layer and therefore likely correspond to defect structures 7 in FIG. 2e. However, the defect structures 401 exhibit a change in propagation direction, as with defect structures 8 in FIG. 2e and are therefore more likely to interact with other defects, resulting in defect annihilation/coalescence and a subsequent reduction in defect density. The reduction in defect density made possible via the methods of this invention can be again be evaluated via FIG. 4. Examination of the left portion of FIG. 4 shows that the cross-section of the GaN film has been separated into three arbitrary regions: region 405, region 407 and region 409. In the region closest to the interface between the substrate and the GaN growth 405 there is clearly a dense population of defected material, corresponding to the multitude of darks lines evident in the region. Above region 405 and into region 407 there is still clearly a large population of defects, however the density has decreased considerably when compared to region 405 and a large portion of the defects within region 407 can be seen to have bent towards a more horizontal direction away from the direction of crystal growth. Finally in region 409, although defects are still evident the density is greatly reduced from those of regions 405 and even 407.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A method for growing a layer of a semiconductor material with reduced defects and dislocations comprising:
   forming a plurality of island like structures comprising a seed material that are arranged on a base substrate without regular pattern,
   applying a masking material to the base substrate, and
   epitaxially growing the semiconductor material so that growth initiates primarily on the seed material of the island-like structures not covered by the masking material and so that growth then continues to form a substantially continuous layer.

2. The method of claim 1 where the semiconductor material comprises an elemental semiconductor, or an alloy semiconductor, or a III-V compound semiconductor or a II-VI compound semiconductor.

3. The method of claim 1 where forming the island like structures further comprises:
   growing a substantially continuous layer of the seed material on the base substrate, and
   thermally treating the base material with the seed material thereon to form island like structures having an average spacing of between about 0.1 and about 10 μm and side facets that are able to remain uncovered by the masking material and exposed in order to be accessible for subsequent epitaxial lateral overgrowth.

4. The method of claim 1 where the masking material acts as an anti-surfactant with respect to the semiconductor material.

5. The method of claim 1 where the seed material acts as a promoter of growth initiation for the semiconductor material.

6. The method of claim 1 wherein the density of defects and dislocations appearing at the surface of the substantially continuous layer is less than the density of defects and dislocations occurring adjacent to the base substrate and on the order of about $5 \times 10^8/cm^2$.

7. A method for growing a layer of a selected III-nitride semiconductor material with reduced defects and dislocations comprising:
   depositing a layer of a III-nitride seed material onto a base substrate,
   thermally treating the base substrate so that a plurality of island like structures of the III-nitride seed material are formed on the base substrate and are arranged without regular pattern,
   applying a dielectric material to the base substrate, and
   epitaxially growing the selected III-nitride semiconductor material so that growth initiates primarily on the portions of the island-like substrates not covered by the dielectric material and then continues to form a substantially continuous layer.

8. The method of claim 7 where the selected III-nitride semiconductor material comprises gallium nitride, or aluminum nitride, or indium nitride, or mixtures thereof.

9. The method of claim 7 where the III-nitride seed material comprises gallium nitride, or aluminum nitride, or indium nitride, or mixtures thereof.

10. The method of claim 7 where the dielectric material comprises a silicon nitride or a silicon oxide or a mixture thereof.

11. The method of claim 7 where the island like structures have an average spacing of between about 0.1 and about 10

μm and include side facets that remain uncovered and exposed in order to be accessible for subsequent epitaxial lateral overgrowth.

12. The method of claim 7 wherein the density of defects and dislocations appearing at the surface of the substantially continuous layer of III-nitride semiconductor material is less than the density of defects and dislocations occurring in the III-nitride seed material adjacent to the base substrate.

13. The method of claim 7 where the substantially continuous planar III-nitride semiconductor has a defect density of less than about $5 \times 10^8/cm^2$.

14. The method of claim 7 where the depositing, the thermally treating, the applying, and the epitaxially growing are performed within a single reactor, within a single growth cycle.

15. A semiconductor structure which comprises:
 a base substrate,
 a plurality of island like structures of a seed material that are suitable for the growth of III-nitride materials and that are arranged on the base substrate without regular pattern, and
 a layer of masking material over the base substrate through which emerge a majority of the island like structures.

16. The structure of claim 15 where the masking material comprises a dielectric material.

17. The structure of claim 16 where the dielectric material comprises a silicon oxide or a silicon nitride or a mixture thereof.

18. The method of claim 15 where the thickness of the masking material is less than about 20 Å.

19. The structure of claim 15 where the seed material comprises GaN, InN, AlN and alloys thereof.

20. The structure of claim 15 where the island like structures have a spatial density suitable for producing a low defect density III-nitride film by mean of epitaxial lateral overgrowth.

21. The structure of claim 15 where the III-nitride island like structures have an average spacing of between about 0.1 to about 10 μm and include side facets that remain uncovered and exposed in order to be accessible for subsequent epitaxial lateral overgrowth.

22. The structure of claim 15 further comprising a layer of a III-nitride material that has a substantially continuous planar surface and that has a base contiguous with at least a portion of the seed material of the island like structures.

23. The structure of claim 22 where the planar surface has a defect density of less than about $5 \times 10^8/cm^2$.

* * * * *

UNITED STATES PATENT AND TRADEMARK OFFICE
CERTIFICATE OF CORRECTION

PATENT NO. : 7,732,306 B2
APPLICATION NO. : 12/180370
DATED : June 8, 2010
INVENTOR(S) : Arena et al.

Page 1 of 1

It is certified that error appears in the above-identified patent and that said Letters Patent is hereby corrected as shown below:

Title Page:
Item (56) References Cited, OTHER PUBLICATIONS, Iwaya et al. reference, before "on sapphire" change "epitaxy" to -- epitaxy-grown GaN --; and before "Japanese" change "GaNn" to -- GaN --.
Item (57) ABSTRACT, line 4 after "growth of nucleation layers on a base substrate," change "thermally" to -- thermal --.

Column 10:
Line 17, before "significant portion" insert -- a --.

Column 13:
Line 15, change "material The" to -- material. The --.
Line 44, before "portion of FIG." change "left" to -- right --.

Signed and Sealed this

Third Day of August, 2010

David J. Kappos
*Director of the United States Patent and Trademark Office*